(12) United States Patent
Kim et al.

(10) Patent No.: US 11,794,451 B2
(45) Date of Patent: Oct. 24, 2023

(54) PROTECTIVE COVER, PROTECTIVE COVER PACKAGE COMPRISING SAME, AND ELECTRONIC DEVICE COMPRISING PROTECTIVE COVER

(71) Applicant: Samsung Electronics Co., Ltd., Gyeonggi-do (KR)

(72) Inventors: Young Gyun Kim, Gyeonggi-do (KR); Jee Young Oh, Gyeonggi-do (KR); Da Um Hwang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 745 days.

(21) Appl. No.: 16/324,936

(22) PCT Filed: Jun. 30, 2017

(86) PCT No.: PCT/KR2017/006966
§ 371 (c)(1),
(2) Date: Feb. 12, 2019

(87) PCT Pub. No.: WO2018/034428
PCT Pub. Date: Feb. 22, 2018

(65) Prior Publication Data
US 2021/0291493 A1 Sep. 23, 2021

(30) Foreign Application Priority Data

Aug. 16, 2016 (KR) .................. 10-2016-0103776

(51) Int. Cl.
*B32B 3/02* (2006.01)
*B32B 27/06* (2006.01)
*B32B 17/06* (2006.01)
*H05K 5/00* (2006.01)
*B32B 27/00* (2006.01)
*B32B 27/12* (2006.01)
(Continued)

(52) U.S. Cl.
CPC .............. *B32B 17/067* (2013.01); *B32B 3/02* (2013.01); *H05K 5/0017* (2013.01); *B32B 27/00* (2013.01);
(Continued)

(58) Field of Classification Search
CPC ........... B32B 3/02; B32B 27/00; B32B 27/06; B32B 27/36; B32B 2307/536;
(Continued)

(56) References Cited

U.S. PATENT DOCUMENTS 7,323,239 B2 * 1/2008 Vanderstappen .. C09J 123/0853
156/244.11
7,957,524 B2 * 6/2011 Chipping ............... G06F 1/1626
206/320

(Continued)

FOREIGN PATENT DOCUMENTS

CN 205439382 U 8/2016
JP 2014109712 A * 6/2014
(Continued)

OTHER PUBLICATIONS

English Language Translation of KR-20160050815-A (Year: 2016).*
(Continued)

*Primary Examiner* — Maria V Ewald
*Assistant Examiner* — Daniel P Dillon
(74) *Attorney, Agent, or Firm* — Cha & Reiter, LLC

(57) ABSTRACT

Various embodiments described herein disclose a protective cover of an electronic device, a protective cover package including the protective cover, and an electronic device to which the protective cover is applied. The protective cover includes a first protective layer including a flat region and a curved region and having a specified transparency, the curved region being disposed at an edge of the flat region and having a specified curvature, a second protective layer
(Continued)

disposed below the first protective layer, the second protective layer being thicker than the first protective layer by a specified thickness or more, a bonding layer for bonding the first protective layer and the second protective layer, and an adhesive layer disposed below the second protective layer, wherein the first protective layer is thicker than the second protective layer. Various embodiments are possible.

13 Claims, 9 Drawing Sheets

(51) Int. Cl.
  *B32B 27/32* (2006.01)
  *B32B 27/36* (2006.01)
(52) U.S. Cl.
  CPC .............. *B32B 27/06* (2013.01); *B32B 27/12* (2013.01); *B32B 27/32* (2013.01); *B32B 27/36* (2013.01); *B32B 2307/536* (2013.01); *B32B 2307/54* (2013.01); *B32B 2307/732* (2013.01); *B32B 2457/00* (2013.01); *Y10T 428/2495* (2015.01)
(58) Field of Classification Search
  CPC . B32B 2307/54; B32B 2457/00; B32B 7/022; Y10T 428/2495
  See application file for complete search history.

(56) References Cited

U.S. PATENT DOCUMENTS

| | | | |
|---|---|---|---|
| 9,669,603 B2 | 6/2017 | Yoon et al. | |
| 9,958,900 B2 | 5/2018 | Han | |
| 11,048,297 B2 | 6/2021 | Han | |
| 2014/0030496 A1* | 1/2014 | Oh | H05K 5/0017 156/60 |
| 2014/0096892 A1* | 4/2014 | Cho | B32B 37/14 156/99 |
| 2015/0125658 A1* | 5/2015 | Bilodeau | D21H 19/34 428/141 |
| 2015/0190999 A1 | 7/2015 | Yoon et al. | |
| 2017/0075444 A1 | 3/2017 | Nade | |
| 2017/0150628 A1* | 5/2017 | Amin | B32B 17/1077 |

FOREIGN PATENT DOCUMENTS

| | | | |
|---|---|---|---|
| JP | 5813051 B2 | | 11/2015 |
| JP | 2015-226204 A | | 12/2015 |
| KR | 20-0466035 | | 3/2013 |
| KR | 10-2013-0054206 A | | 5/2013 |
| KR | 20140080188 A | * | 6/2014 |
| KR | 10-2014-0142633 A | | 12/2014 |
| KR | 10-1530520 B1 | | 6/2015 |
| KR | 10-2015-0081926 A | | 7/2015 |
| KR | 10-2016-0008722 A | | 1/2016 |
| KR | 10-2016-0050815 A | | 5/2016 |
| KR | 20160050815 A | * | 5/2016 |
| KR | 101717507 B1 | * | 3/2017 |

OTHER PUBLICATIONS

English Language Translation of KR 10-1717507 (Year: 2017).*
English Language Translation of KR-20140080188-A (Year: 2014).*
English Language Translation of JP-2014109712-A (Year: 2014).*
European Search Report dated Jul. 5, 2019.
Korean Office Action dated Aug. 8, 2023.

* cited by examiner

PROTECTIVE COVER, PROTECTIVE
COVER PACKAGE COMPRISING SAME,
AND ELECTRONIC DEVICE COMPRISING
PROTECTIVE COVER

CLAIM OF PRIORITY

This application is a National Phase Entry of PCT International Application No. PCT/KR2017/006966, which was filed on Jun. 30, 2017 and claims a priority to Korean Patent Application No. 10-2016-0103776, which was filed on Aug. 16, 2016, the contents of which are incorporated herein by reference.

TECHNICAL FIELD

Various embodiments relate to a protective cover of an electronic device.

BACKGROUND ART

An electronic device in the related art may include a display module that outputs a screen according to execution of a function. The display module of the electronic device may be exposed to the outside on the whole for recognition of the screen, and side portions of the display module may be surrounded by a housing.

DISCLOSURE

Technical Problem

When an external force is exerted on the conventional electronic device, the edge of the display module may be easily damaged.

Aspects of the present disclosure are to address at least the above-mentioned problems and/or disadvantages and to provide at least the advantages described below. Accordingly, an aspect of the present disclosure is to provide a protective cover that wholly adheres to a mobile electronic device, at least part of which has a curved surface, a protective cover package including the protective cover, and an electronic device including the protective cover.

Technical Solution

In accordance with an aspect of the present disclosure, a protective cover of an electronic device may include a first protective layer including a flat region and a curved region and having a specified transparency, the curved region being disposed at at least part of an edge of the flat region and having a specified curvature, a second protective layer disposed below (or under) the first protective layer, the second protective layer being thicker than the first protective layer by a specified thickness or more, a bonding layer for bonding the first protective layer and the second protective layer, and an adhesive layer disposed below (or under) the second protective layer. The second protective layer may be thicker than the first protective layer.

In accordance with another aspect of the present disclosure, a protective cover package of an electronic device may include: a protective cover of the electronic device that includes a first protective layer including a flat region and a curved region and having a specified transparency, the curved region being disposed at at least part of an edge of the flat region and having a specified curvature, a second protective layer disposed below (or under) the first protective layer, the second protective layer being thicker than the first protective layer by a specified thickness or more, a bonding layer for bonding the first protective layer and the second protective layer, and an adhesive layer disposed below (or under) the second protective layer, wherein a structure including the first protective layer and the second protective layer has a tensile modulus in a range of 300 MPA to 1500 MPA; first release paper disposed above the first protective layer; and second release paper disposed below (or under) the adhesive layer, wherein the first release paper is formed to be thicker than the first protective layer.

In accordance with another aspect of the present disclosure, an electronic device may include a protective cover and a display module to which the protective cover adheres, wherein at least part of the display module includes a curved display area. The protective cover may include a first protective layer including a flat region and a curved region and having a specified transparency, the curved region being disposed at at least part of an edge of the flat region and having a specified curvature, a second protective layer disposed below (or under) the first protective layer, the second protective layer being thicker than the first protective layer by a specified thickness or more, a bonding layer for bonding the first protective layer and the second protective layer, and an adhesive layer disposed below (or under) the second protective layer. A structure including the first protective layer and the second protective layer may have a tensile modulus of 300 MPA to 1500 MPA.

Advantageous Effects

As described above, various embodiments may prevent damage caused by an external force and may prevent a fingerprint from being left, while implementing a gorgeous aesthetic sense and an excellent grip of a display module of a mobile electronic device, at least part of which has a curved surface.

Furthermore, various embodiments of the present disclosure may prevent a three-wavelength rainbow phenomenon, an oil ring phenomenon, or a reflection distortion phenomenon on a display module and may prevent discoloration by a service environment while preventing pressing by an external force.

In addition, various embodiments of the present disclosure may provide a protective cover that prevents separation between the protective cover for a display module and an electronic device, maintains an adhesive force on a curved surface of the display module, minimizes a forming error or an error generated during attachment.

MODE FOR INVENTION

Figure 1:
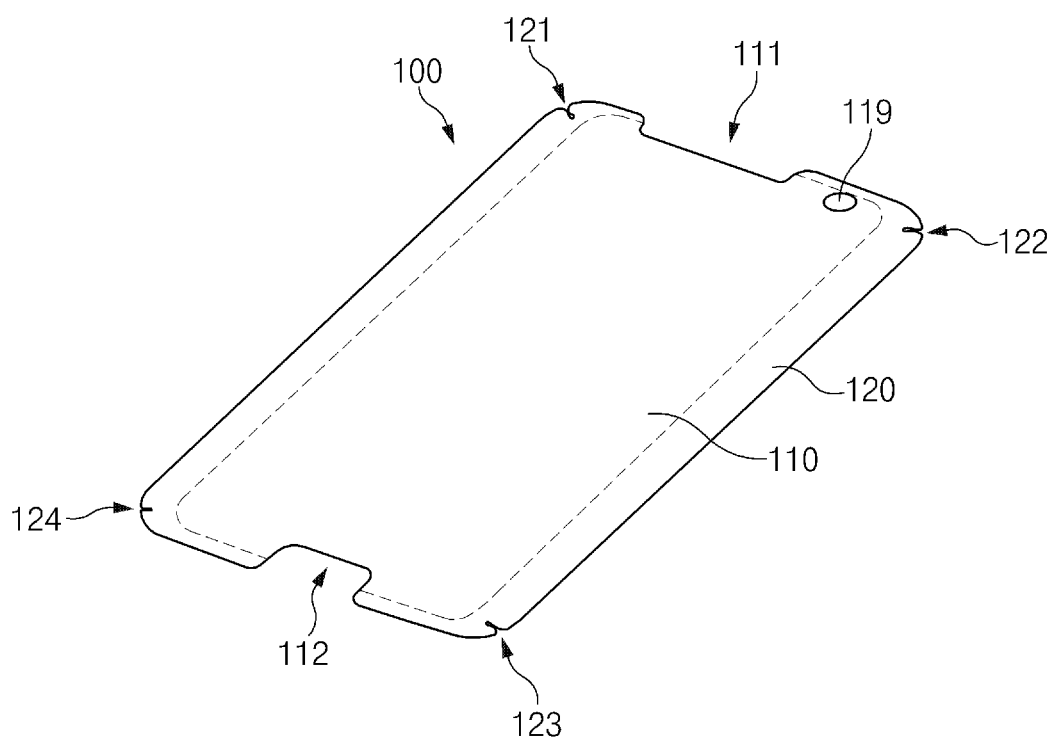
FIG. 1 is a view illustrating a state before a protective cover according to an embodiment of the present disclosure is shaped into a curved form.

Hereinafter, various embodiments of the present disclosure may be described with reference to accompanying drawings. Accordingly, those of ordinary skill in the art will recognize that modification, equivalent, and/or alternative on the various embodiments described herein can be variously made without departing from the scope and spirit of the present disclosure. With regard to description of drawings, similar components may be marked by similar reference numerals.

In the present disclosure, the expressions "have", "may have", "include" and "comprise", or "may include" and "may comprise" used herein indicate existence of corresponding features (e.g., components such as numeric values, functions, operations, or parts) but do not exclude presence of additional features.

In the present disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in the present disclosure may be used to refer to various components regardless of the order and/or the priority and to distinguish the relevant components from other components, but do not limit the components. For example, "a first user device" and "a second user device" indicate different user devices regardless of the order or priority. For example, without departing the scope of the present disclosure, a first component may be referred to as a second component, and similarly, a second component may be referred to as a first component.

It will be understood that when an component (e.g., a first component) is referred to as being "(operatively or communicatively) coupled with/to" or "connected to" another component (e.g., a second component), it may be directly coupled with/to or connected to the other component or an intervening component (e.g., a third component) may be present. In contrast, when an component (e.g., a first component) is referred to as being "directly coupled with/to" or "directly connected to" another component (e.g., a second component), it should be understood that there are no intervening component (e.g., a third component).

According to the situation, the expression "configured to" used in the present disclosure may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other parts. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in the present disclosure are used to describe specified embodiments and are not intended to limit the scope of the present disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of the present disclosure. In some cases, even if terms are terms which are defined in the present disclosure, they may not be interpreted to exclude embodiments of the present disclosure.

An electronic device according to various embodiments of the present disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit).

According to various embodiments, the electronic device may be a home appliance. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, and the like.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, Global Navigation Satellite System (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, automated teller machines (ATMs), points of sales (POSs) of stores, or internet of things (e.g., light bulbs, various sensors, electric or gas meters, sprinkler devices, fire alarms, thermostats, street lamps, toasters, exercise equipment, hot water tanks, heaters, boilers, and the like).

According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like). According to various embodiments, the electronic device may be one of the above-described devices or a combination thereof. An electronic device according to an embodiment may be a flexible electronic device. Furthermore, an electronic device according to an embodiment of the present disclosure may not be limited to the above-described electronic devices and may include other electronic devices and new electronic devices according to the development of technologies.

Hereinafter, electronic devices according to various embodiments will be described with reference to the accompanying drawings. In the present disclosure, the term "user" may refer to a person who uses an electronic device or may refer to a device (e.g., an artificial intelligence electronic device) that uses the electronic device.

Figure 2:
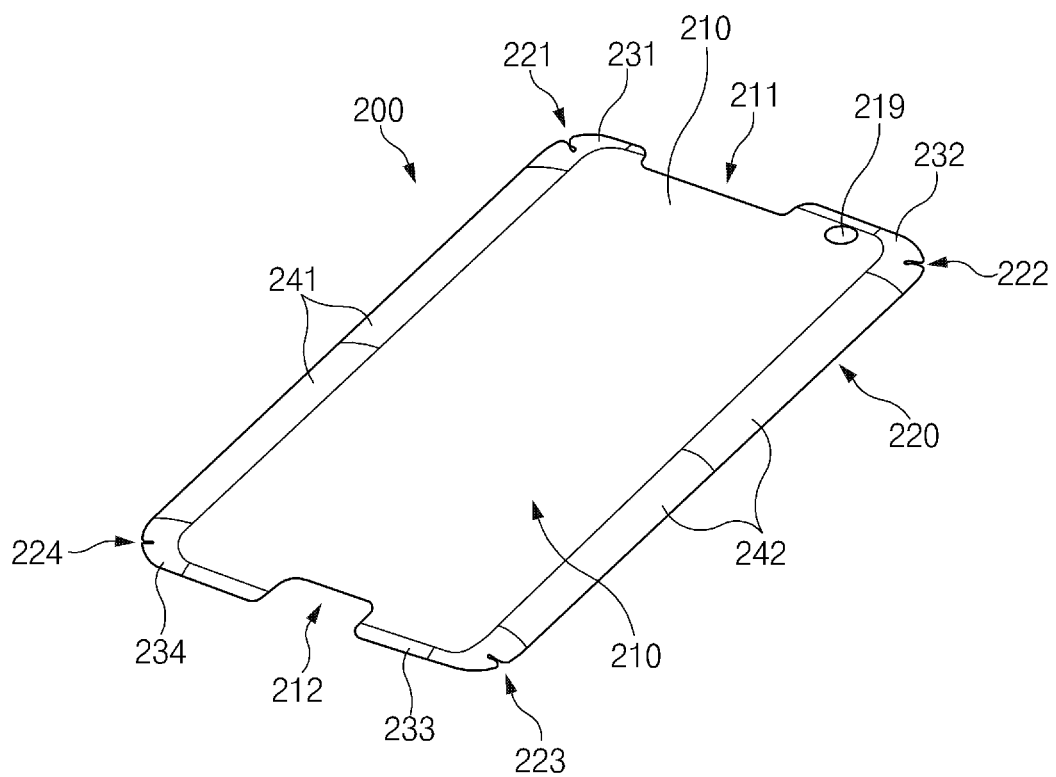
FIG. 2 is a view illustrating a state after the protective cover according to the embodiment of the present disclosure is shaped into a curved form.

FIG. 1 is a view illustrating a state before a protective cover according to an embodiment of the present disclosure is shaped into a curved form, and FIG. 2 is a view illustrating a state after the protective cover according to the embodiment of the present disclosure is shaped into a curved form.

Referring to FIG. 1, the protective cover of the present disclosure may have various layers (e.g., release paper, a protective layer, a bonding layer or an adhesive layer, a coating layer, and the like) stacked one above another, which will be described below. For example, the protective cover may include two sheets of release paper with different thicknesses that are disposed at the top and the bottom thereof with predetermined spacing therebetween, a plurality of protective layers with different rigidities that are disposed between the two sheets of release paper, and a bonding layer or an adhesive layer disposed between the plurality of protective layers. Among the plurality of protective layers, a protective layer placed at the top may include at least one of a coating layer for preventing scratches by an electronic pen, a user's fingernail, or other mechanical parts (e.g., a pencil or a ballpoint pen) or a coating layer for preventing a residual fingerprint according to contact of the user's finger. Among the plurality of protective layers, a protective layer placed at the bottom may be formed of, for example, a material with a tensile modulus of 300 Mega Pascal (MPA) to 1500 MPA for adhesion to an electronic device.

A flat protective cover 100 may include a main portion 110 occupying the central portion thereof and an outer portion 120 disposed at the edge (or the periphery) of the main portion 110. The main portion 110 may have, for example, a substantially flat shape and may have an area corresponding to the size of at least part of the central region of the front surface of a display module of the electronic device. For example, a camera hole 119 for exposure of a camera may be disposed in a predetermined position of the main portion 110. The display module may include, for example, a display associated with screen display and a protective cover (e.g., window glass) disposed on the display. According to various embodiments, the display module may include the display, the protective cover, and a touch panel.

The outer portion 120 may have a predetermined width and length and may be disposed at the periphery of the main portion 110. The outer portion 120 may include, for example, an upper recess 111 and a lower recess 112 formed to correspond to exposed regions of a structure disposed on the front surface of the display module protected. The upper recess 111 may be disposed in a predetermined region of the upper central section of the outer portion 120, and the lower recess 112 may be disposed in a predetermined region of the lower central section of the outer portion 120. At least one cut-away portion may be disposed in the outer portion 120. For example, the outer portion 120 may include a first cut-away portion disposed in the upper left corner region, a second cut-away portion 122 disposed in the upper right corner region, a third cut-away portion 123 disposed in the lower right corner region, and a fourth cut-away portion 124 disposed in the lower left corner region. For example, the cut-away portions 121, 122, 123, and 124 may be disposed with a predetermined gap. The cut-away portions 121, 122, 123, and 124 may act to prevent creases while the flat protective cover 100 is being shaped into a curved protective cover.

Referring to FIG. 2, the flat protective cover 100 may be shaped into a curved protective cover 200 in which at least part of the outer portion includes a curved portion with a predetermined curvature. The curved protective cover 200 may include, for example, a flat region 210 and a curved region 220. The flat region 210 may have a specified flatness (degree of flatness) and may have an area corresponding to the size of at least a partial area of the front surface of the display module of the electronic device (e.g., at least part of the flat front region of the display module). The camera hole 119 for exposure of a camera lens may be disposed in a predetermined position (e.g., on the upper right side) of the flat region 210.

The curved region 220 may be disposed at the periphery of the flat region 210 and may have a specified curvature. For example, the curved region 220 may include a first curved portion 231 formed in a predetermined region on the upper left side, a second curved portion 232 formed in a predetermined region on the upper right side, a third curved portion 233 formed in a predetermined region on the lower right side, a fourth curved portion 234 formed in a predetermined region on the lower left side, a left-side curved portion 241 disposed at the left-side edge of the flat region 210, and a right-side curved portion 242 disposed at the right-side edge of the flat region 210.

The left-side curved portion 241 may be disposed between the first curved portion 231 and the fourth curved portion 234. The right-side curved portion 242 may be disposed between the second curved portion 232 and the third curved portion 233. The left-side curved portion 241 may have a first curvature (e.g., a curvature corresponding to the surface curvature of the left-side edge region of the display module). The right-side curved portion 242 may have a second curvature (e.g., a curvature corresponding to the surface curvature of the right-side edge region of the display module). In the case where the curvatures of the left- and right-side edges of the display module of the electronic device differ from each other, the curvature of the left-side curved portion 241 and the curvature of the right-side curved portion 242 may differ from each other. In the case where the display module of the electronic device has bilateral symmetry with respect to the vertical center line, the first curvature of the left-side curved portion 241 may be the same as the second curvature of the right-side curved portion 242. The first curved portion 231 and the second curved portion 232 may be formed such that at least part of the first curved portion 231 is symmetric to at least part of the second curved portion 232 with respect to the vertical center line. The third curved portion 233 and the fourth curved portion 234 may be formed such that at least part of the third curved portion 233 is symmetric to at least part of the fourth curved portion 234 with respect to the vertical center line. The curvatures of the first curved portion 231 and the second curved portion 232 may be similar to or the same as each other. The curvatures of the third curved portion 233 and the fourth curved portion 234 may be similar to or the same as each other. The curvatures of the first curved portion 231 and the third curved portion 233 may be the same as each other. According to various embodiments, the first curved portion 231 and the third curved portion 233 may have different curvatures to correspond to the shape of the display module of the electronic device. For example, the first curved portion 231 may have a relatively larger curvature (e.g., may be more sharply curved) than the third curved portion 233.

The curved region 220 may further include a first curved cut-away portion 221 formed in the upper left corner, a second curved cut-away portion 222 formed in the upper right corner, a third curved cut-away portion 223 formed in the lower right corner, and a fourth curved cut-away portion 224 formed in the lower left corner. For example, the first curved cut-away portion 221 may be formed in the first curved portion 231 and may have a predetermined length and width in a direction from the center of the flat region 210 to the outside. The second curved cut-away portion 222 may be formed in the second curved portion 232, the third curved cut-away portion 223 may be formed in the third curved portion 233, and the fourth curved cut-away portion 224 may be formed in the fourth curved portion 234. For example, the second curved cut-away portion 222, the third curved cut-away portion 223, and the fourth curved cut-away portion 224 may be different from the first curved cut-away portion 221 in terms of direction and may be similar to the first curved cut-away portion 221 in terms of size and shape.

An upper recess 211 and a lower recess 212, which are cut in a predetermined size, may be disposed in partial areas of the curved region 220. The upper recess 211 may be disposed, for example, in a predetermined area at the top of the curved region 220 and may be biased to the left side with respect to the drawing. The lower recess 212 may be disposed in a predetermined area at the bottom of the curved region 220 and may be disposed in the central area.

Figure 3:
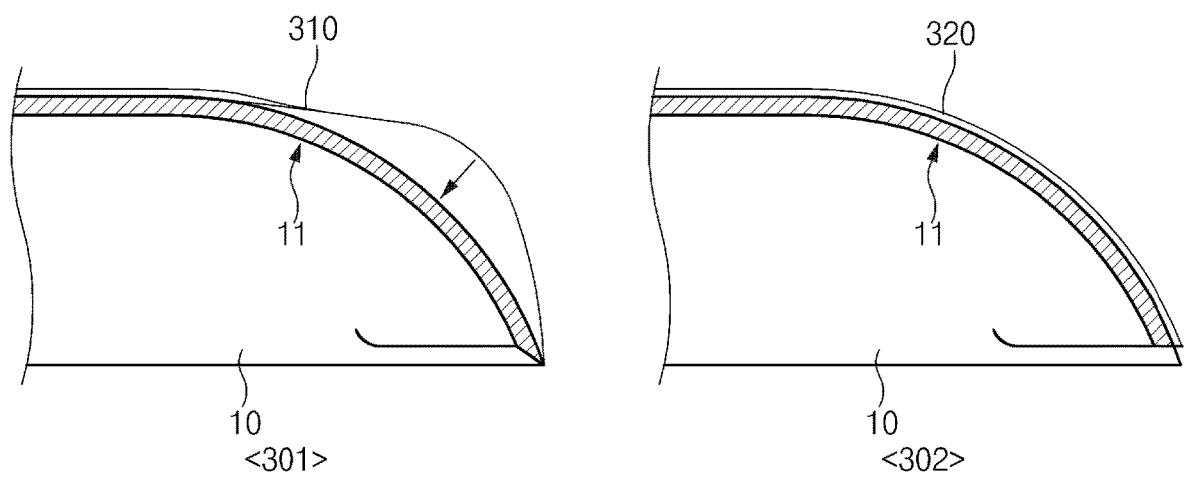
FIG. 3 is a view illustrating adhesion states of a protective cover according to an embodiment of the present disclosure.

FIG. 3 is a view illustrating adhesion states of a protective cover according to an embodiment of the present disclosure.

Referring to FIG. 3, an electronic device 10 may be an edge-type electronic device in which at least a partial area of the edge has a specified curvature. As mentioned above, an upper protective layer of a protective cover 310 or 320 may include at least one coating layer that has a predetermined hardness and is associated with prevention of scratches, and a lower protective layer of the protective cover 310 or 320 may have a specified tensile modulus in relation to adhesion. Furthermore, the protective cover 310 or 320 may include an adhesive layer on the inside thereof and may be attached to the surface of the electronic device 10 (e.g., the surface of a display module 11). For example, the electronic device 10 may include a glass cover disposed on the display module 11, and the protective cover 310 or 320 may be disposed to cover the glass cover disposed on the display module 11. Accordingly, the adhesive layer on the inside of the protective cover 310 or 320 may be attached to the glass cover.

As in state 301, the protective cover 310 and the display module 11 of the electronic device 10 may be separated from each other when the adhesive layer disposed on the inside of the protective cover 310 does not have a specified adhesive force. As in state 302, the protective cover 320 and the display module 11 of the electronic device 10 may adhere to each other without an empty space therebetween when the adhesive layer disposed on the inside of the protective cover 320 has a specified adhesive force. According to an embodiment, the tensile elastic force of at least a partial area (e.g., a curved area) of the protective cover 320 may be less than or equal to the adhesive force of the adhesive layer disposed on the inside of the protective cover 320.

Figure 4:
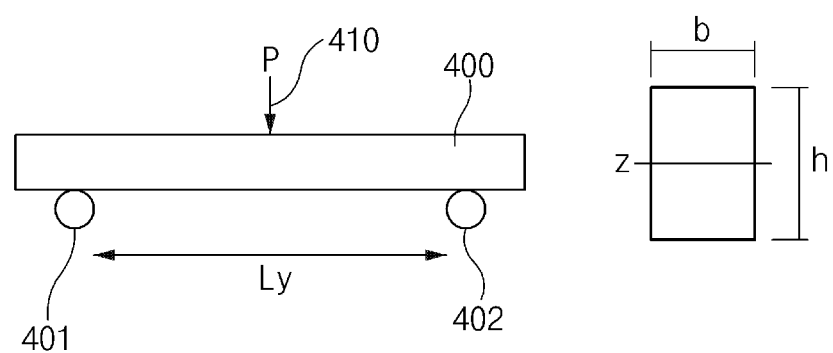
FIG. 4 is a view for explaining calculation of an adhesive force or a tensile modulus of a protective cover according to an embodiment of the present disclosure.

FIG. 4 is a view for explaining calculation of an adhesive force or a tensile modulus of a protective cover according to an embodiment of the present disclosure.

Referring to FIG. 4, in the case where a protective cover 400 has a first width b and a first thickness h, a bending load P 410 exerted on the protective cover 400 placed on jigs 401 and 402 may be given by Equation 1, and the second moment of area of the protective cover 400, which has the first width b and the first thickness h, may be given by Equation 2.

$$P = 4EI/L \qquad \text{[Equation 1]}$$

Here, "P" denotes the bending load, "E" denotes the tensile modulus, "I" denotes the second moment of area, and "L" denotes the length by which the protective cover 400 is elongated.

$$I = bh^3/12 \qquad \text{[Equation 2]}$$

Here, "I" denotes the second moment of area, "b" denotes the width of the protective cover 400, and "h" denotes the thickness of the protective cover 400.

Consequently, the bending load 410 may be proportional to the tensile modulus E and may be proportional to the cube of the thickness h of the protective cover 400. When a bending load or bending stiffness represents resistance of a material to an external force, a tensile modulus E may represent a force that the material bears when the external force is applied to the material in the bending direction or the tensile direction. For example, a material with a high tensile modulus E may have a high hardness and therefore may easily bear force acting thereon in a bending or tensile direction. In a structure in which a material to maintain a separation state is forcibly bent and attached by using an adhesive force as illustrated in FIG. 3, the adhesion may be maintained when a bending load is less than or equal to the adhesive force (e.g., when the adhesive force is greater than the bending load). Additionally, although there is a deviation according to the material of the protective cover 400, experimental results show that it is difficult to remove bubbles when the bending load is 400 gf/in or more. Based on the above-described conditions, the protective cover 400 may be designed to have a combination of a tensile modulus E and a thickness by which the bending load of a composite material does not exceed 400 gf/in in the state in which the maximum value of the bending load is set to 400 gf/in. The protective cover 400 according to the embodiment of the present disclosure may have the combination of the tensile modulus E and the thickness and may employ a composite material.

Figure 5:
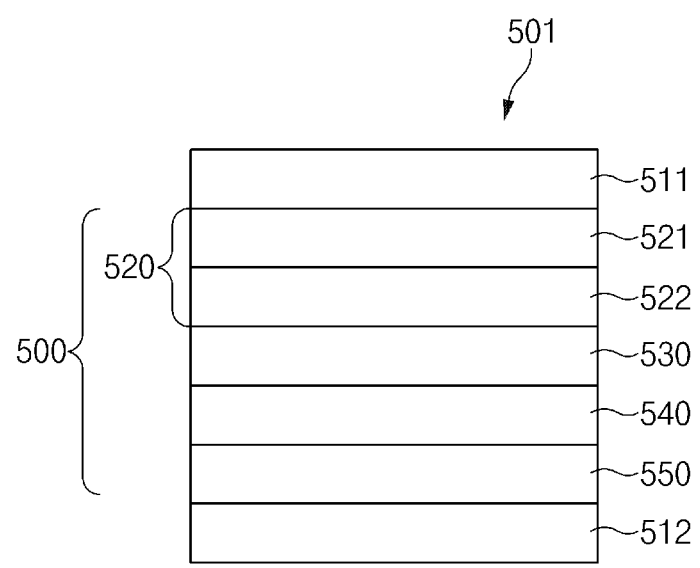
FIG. 5 is a view illustrating a stack structure of a protective cover package according to an embodiment of the present disclosure.

FIG. 5 is a view illustrating a stack structure of a protective cover package according to an embodiment of the present disclosure.

Referring to FIG. 5, a protective cover package 501 according to an embodiment of the present disclosure may include first release paper 511, a first protective layer 520, a bonding layer 530, a second protective layer 540, an adhesive layer 550, and second release paper 512. While the protective cover package 501 is illustrated in a flat shape in FIG. 5 for the convenience of description, the protective cover package 501 may be formed such that the edge region has a specified curvature, as described above with reference to FIG. 2. Here, a protective cover 500 may include the first protective layer 520, the bonding layer 530, the second protective layer 540, and the adhesive layer 550.

The first release paper 511 may be disposed on the front surface of the protective cover 500 to protect the first protective layer 520 from scratches. The first release paper 511 may be formed of, for example, polyethylene terephthalate (PET). The first release paper 511 may be removed in the process of attaching the protective cover 500 to a display module of an electronic device. According to various embodiments, an adhesive layer may be additionally disposed between the first release paper 511 and the first protective layer 520. When the first release paper 511 is removed, the adhesive layer disposed between the first release paper 511 and the first protective layer 520 may be removed together with the first release paper 511.

According to various embodiments, the first protective layer 520 and the second protective layer 540 may be laminated at a predetermined temperature (e.g., 200 degrees of Celsius), and the protective cover 500 may be curved due to different coefficients of thermal expansion of the first protective layer 520 and the second protective layer 540 as the protective cover 500 is cooled. Therefore, the first release paper 511 may be formed to be thicker than the first protective layer 520 and the second protective layer 540 by a specified thickness or more. For example, in the case where the first protective layer 520 has a thickness of 25 µm to 75 µm (e.g., 25 µm) and the second protective layer 540 has a thickness of 40 µm, the first release paper 511 may have a thickness of 60 µm to 100 µm (e.g., 65 µm or 75 µm). Since the first release paper 511 has a predetermined thickness and is disposed above the first protective layer 520 and the second protective layer 540, the protective cover 500 may be prevented from being curved. According to an embodiment, since the second protective layer 540 is more curved than the first protective layer 520 in the protective cover package formed such that the edge portion has a predetermined curvature, the curved portion of the second protective layer 540, which is curved through forming, may have a property of being flattened at room temperature. The first release paper 511 with a sufficient thickness may appropriately press the edge portion of the protective cover 500 to maintain the curved state.

According to various embodiments, the first release paper 511 may be thicker than the second release paper 512 by a specified thickness or more. To prevent the restoration characteristic of the curved portion of the protective cover 500, the first release paper 511 may be formed to be thicker than the second release paper 512 by the specified thickness or more, thereby offsetting the restoration characteristic of the curved portion of the protective cover 500. Accordingly, the first release paper 511 may serve to prevent unbending of the protective cover 500.

The first protective layer 520 may be disposed at the outermost location of the display module in the process of attaching the protective cover 500 to the front surface of the display module of the electronic device and may serve to protect the electronic device. For example, a fingernail or an electronic pen may be brought into contact with the first protective layer 520 during a touch of a user. Alternatively, various mechanical parts (e.g., a pencil or a ballpoint pen) may be brought into contact with the first protective layer 520 according to user operation. The first protective layer 520 may include a first coating layer 521 for preventing scratches during the contact of various mechanical parts and a high-hardness support layer 522 for supporting the first coating layer 521. For example, the first protective layer 520 may have a thickness of 25 µm to 75 µm. The thickness may vary depending on characteristics (e.g., the area or the curvature of a curved region) of an applied electronic device.

The first coating layer 521 may include, for example, a hard coating layer formed on the high-hardness support layer 522. Alternatively, the first coating layer 521 may include an anti-fingerprint (AF) layer formed on the high-hardness support layer 522. According to an embodiment, the first coating layer 521 may include a hard coating layer disposed on the high-hardness support layer 522 and an AF layer disposed on the hard coating layer. According to an embodiment, the first coating layer 521 may include one layer (simultaneously performing hard coating and AF functions) that is prepared by mixing a material associated with the AF layer with the material of which the hard coating layer is formed.

The high-hardness support layer 522 may be formed of a material of which the hard coating layer is formed. Alternatively, the high-hardness support layer 522 may be formed of a material that has such a tensile modulus (e.g., 2 GPa to 6 GPa) that plastic deformation due to pressing or stamping hardly occurs. In another case, the high-hardness support layer 522 may be formed of a material that has an antifouling function against foreign matter or a fingerprint and has a slip property of a predetermined magnitude or more. For attachment to an electronic device, at least part of which has a specified curvature or more, the high-hardness support layer 522 may be formed of a high-precision material on which 3D thermal forming (e.g., forming by which an edge portion has a curved shape) can be performed. According to various embodiments, the high-hardness support layer 522 may be formed of a thermoplastic material with a heat resistance of 200 degrees or less that is thermally formed in a general environment. The high-hardness support layer 522 may have a thickness of 25 µm to 125 µm. The high-hardness support layer 522 may more sufficiently suppress a separation phenomenon or generation of bubbles than when a protective cover is formed in a single PET film form.

According to an embodiment, the high-hardness support layer 522 may be formed of PET with the aforementioned thickness (e.g., 25 µm).

The bonding layer 530 may be disposed between the first protective layer 520 and the second protective layer 540 to bond the first protective layer 520 and the second protective layer 540. The bonding layer 530 may be formed of, for example, a transparent adhesive material (e.g., optical clear adhesive (OCA)). The bonding layer 530 may have a thickness of 5 µm to 30 µm (e.g., 10 µm). Since the bonding layer 530 is relatively thin and is less affected by a tensile modulus, the bonding layer 530 may be negligible in regard to the tensile modulus of the protective cover 500.

The second protective layer 540 may be attached to the first protective layer 520 through the bonding layer 530. The second protective layer 540 may be formed of, for example, a material that has a specified elongation or more (e.g., 210%) and has a small difference in material property in the vertical and horizontal directions and may be formed of a material that has a specified tensile modulus or less (e.g., 1.5 Giga Pascal (GPa)). Furthermore, similarly to the first protective layer 520, the second protective layer 540 may be formed of a material that is not plastically deformed due to pressing or stamping and has a specified tensile modulus or more (e.g., 0.3 GPa or more). Also, the second protective layer 540 may be formed of a material that does not cause a reflection distortion phenomenon and a three-wavelength rainbow yellowing phenomenon and has high precision in 3D thermal forming. Similarly to the first protective layer 520, the second protective layer 540 may be formed of a material that is thermally formed in a general environment (e.g., a thermoplastic material with a heat resistance of 200 degrees or less) and may have a thickness of 25 μm to 125 μm (e.g., 40 μm). The second protective layer 540 has a large elongation value (is elongated well) and has a small difference in material property according to a mechanical direction (MD)/a transverse direction (TD). The second protective layer 540 may be formed of, for example, a polyolefine (PO) film, a casting polypropylene (CPP) film, a cast PET or a non-oriented PET, a cyclo olefin polymer, or the like.

The adhesive layer 550 may be disposed below the second protective layer 540 to attach the second protective layer 540 to the surface of the display module of the electronic device. The adhesive layer 550 may have an adhesive force of, for example, 100 gf/in to 500 gf/in. In the case where the first protective layer 520 and the second protective layer 540 have specified thicknesses (e.g., 25 μm and 40 μm), respectively, and are formed of different materials as described above, the sum of the tensile modulus of the first protective layer 520 and the modulus of the second protective layer 540 may be less than the adhesive force. Accordingly, the adhesive layer 550 may provide an appropriate adhesive force even in a curved region of the surface of the display module of the electronic device to prevent separation between the protective cover 500 and the display module. The adhesive layer 550 may be formed of, for example, a pressure sensitive adhesive (PSA) material and may have a thickness of 25 μm to 50 μm (e.g., 30 μm). The numerical value relating to the tensile modulus of the adhesive layer 550 in the protective cover 550 may be negligible due to the nature of the material property and the thickness of the adhesive layer 550.

The second release paper 512 may be disposed below the adhesive layer 550 and may be removed before the protective cover 500 is attached to the display module of the electronic device. The second release paper 512 may be formed of the substantially the same material (e.g., PET) as that of the first release paper 511. The second release paper 512 may be formed to be thinner than the first release paper 511. For example, in the case where the first release paper 511 has a thickness of 60 μm to 100 μm, the second release paper 512 may have a thickness of 25 μm to 50 μm. Since the second release paper 512 is formed to be relatively sufficiently thinner than the first release paper 511, forward curl (e.g., a phenomenon in which the protective cover 500 is curved toward the first release paper 511) may be prevented.

As described above, the protective cover package 501 according to the embodiment of the present disclosure may include the composite materials (e.g., the first protective layer 520 and the second protective layer 540), each having a tensile modulus less than an adhesive force, between the first release paper 511 disposed on the front surface of the protective cover 500 and the second release paper 512 disposed on the rear surface of the protective cover 500. In this case, since the first protective layer 520 includes the hard coating layer and the AF layer, the protective cover 500 may suppress plastic deformation due to pressing or stamping, and since the second protective layer 540 is formed of a material with a relatively high tensile modulus, the protective cover 500 may prevent a separation phenomenon in the curved edge region even though being disposed on the front surface of the display module of the electronic device.

Figure 6:
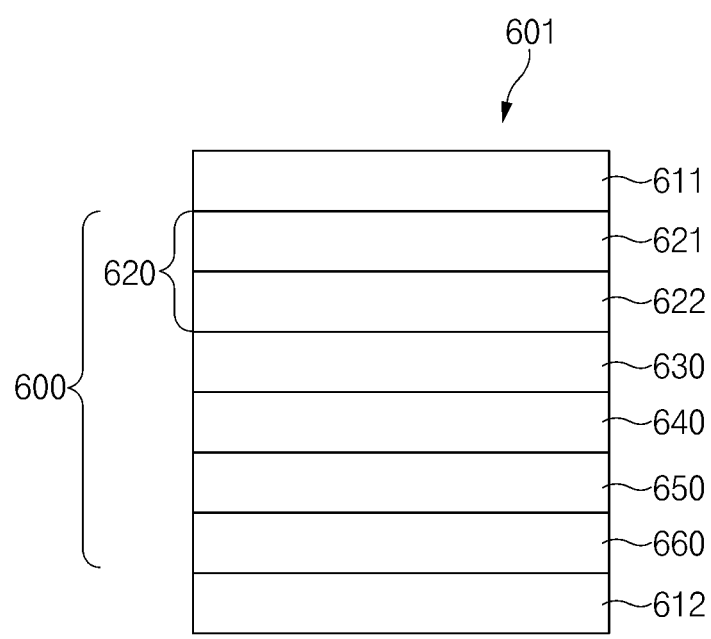
FIG. 6 is a view illustrating a stack structure of a protective cover package according to another embodiment of the present disclosure.

FIG. 6 is a view illustrating a stack structure of a protective cover package according to another embodiment of the present disclosure.

Referring to FIG. 6, a protective cover package 601 according to an embodiment of the present disclosure may have a structure in which a protective cover is disposed between front release paper and rear release paper. The protective cover package 601 may include, for example, the front release paper (e.g., first release paper 611), a first protective layer 620, a bonding layer 630, a second protective layer 640, an adhesive layer 650, a release paper coating layer 660 (or a slip layer), and the rear release paper (e.g., second release paper 612). While the protective cover package 601 is illustrated in a flat shape in FIG. 6 for the convenience of description, the edge region of the protective cover package 601 may be formed in a curved shape with a specified curvature, as described above with reference to FIG. 2.

Among the components of the protective cover package 601, the first release paper 611, the first protective layer 620, the bonding layer 630, the second protective layer 640, the adhesive layer 650, and the second release paper 612 may be substantially the same as or similar to the first release paper, the first protective layer, the bonding layer, the second protective layer, the adhesive layer, and the second release paper described above with reference to FIG. 5.

The release paper coating layer 660 may be disposed on the second release paper 612 to provide a slip property with a protective cover 600. According to an embodiment, the second release paper 612 AF layer may be formed on the release paper coating layer 660. Since the release paper coating layer 660 is disposed between the second release paper 612 and the adhesive layer 650, the adhesive layer 650 may slip (slide) along the surface of the release paper coating layer 660 in the region in which the protective cover 600 is curved. Accordingly, the release paper coating layer 660 may reduce a frictional force with the adhesive layer 650, thereby suppressing a curling phenomenon that occurs in a curved section according to thermal expansion or thermal contraction of the protective cover 600 (expansion or contraction by absorbing or radiating heat). For example, the second release paper 612 may cause a slip at the interface with the adhesive layer 650 based on an AF coating layer (e.g., the release paper coating layer 660), thereby preventing residual stress at the interface due to a high PSA adhesive force.

The above-described protective cover 600 according to the embodiment of the present disclosure may be attached to a 3D glass window (a protective layer disposed on the display module of the electronic device and having at least a portion curved) and a back cover (a cover disposed on the rear surface of the housing of the electronic device and having at least a portion curved, the cover being finished by glass) to prevent drop and damage in a consumer environment. Furthermore, the protective cover 600 according to the embodiment of the present disclosure may have a shape with excellent attachment to a 3D curved window, may prevent a separation phenomenon, and may have a relatively excellent attachment property. In addition, the protective cover 600 of the present disclosure may have a relatively high surface hardness, an anti-scratch property, a feature wherein a pressure mark is not caused, and relatively excellent surface quality (e.g., three-wavelength surface quality such as reflection distortion, distortion, an oil ring phenomenon, or a rainbow phenomenon, initial feeling of yellow, and yellowing in a service environment).

Figure 7A:
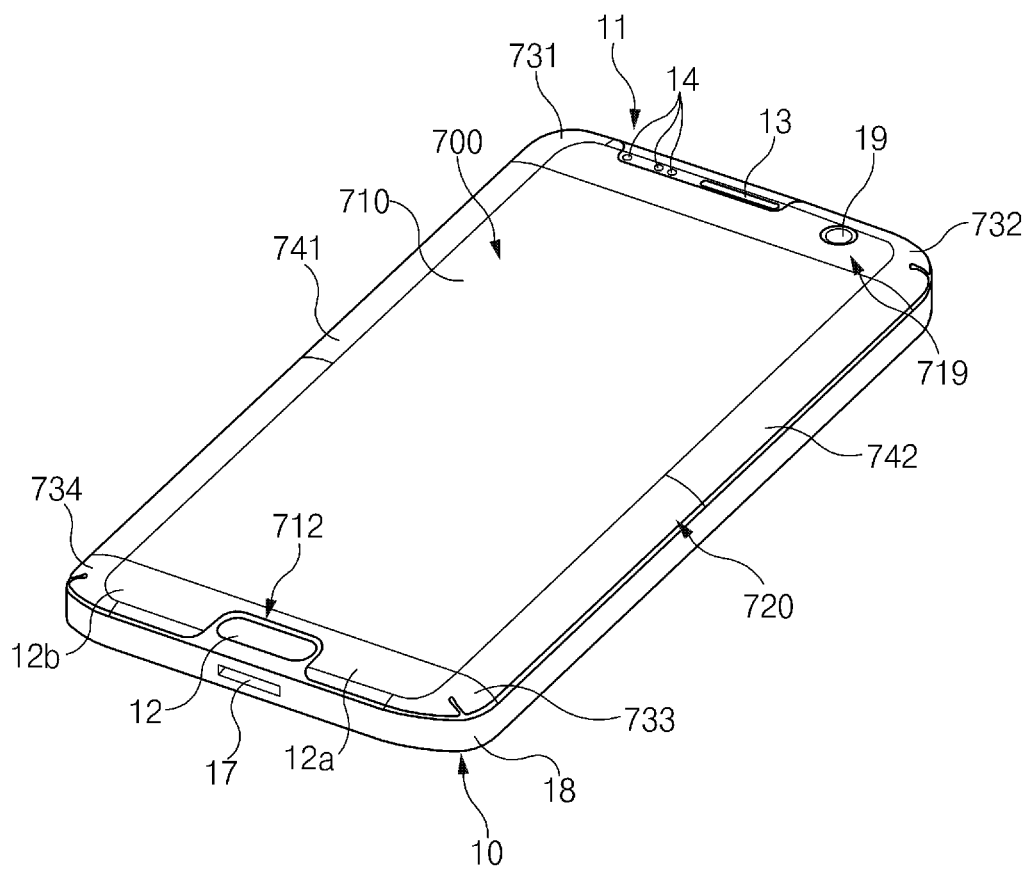
FIG. 7A is a schematic view illustrating the appearance of an electronic device to which a protective cover according to an embodiment of the present disclosure is applied.
Figure 7B:
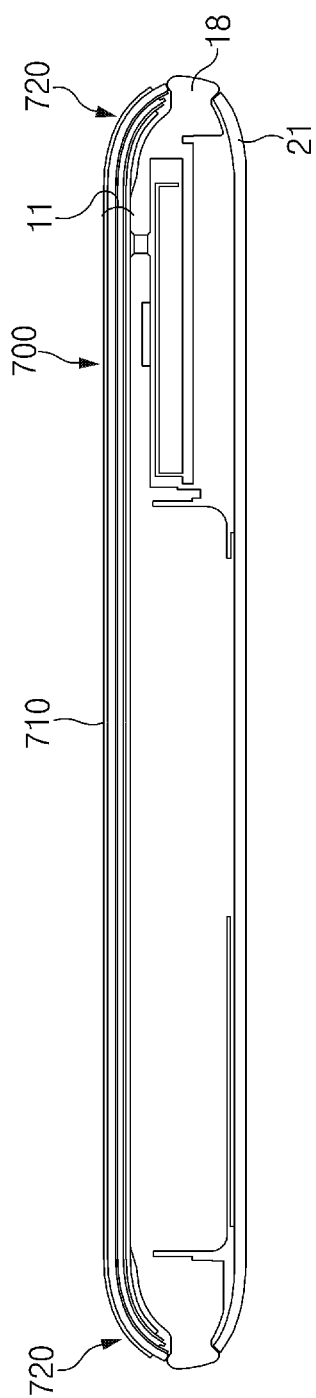
FIG. 7B is a view illustrating a cut section of the electronic device to which the protective cover according to the embodiment of the present disclosure is applied.
Figure 7C:
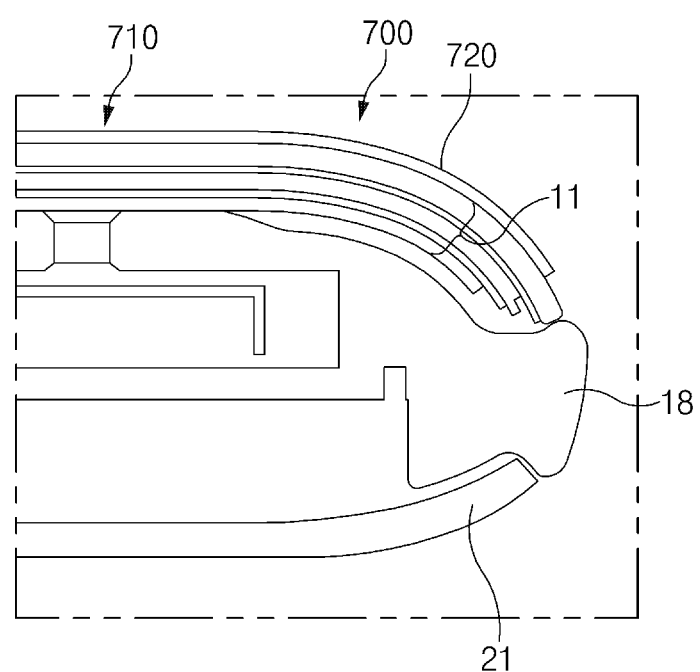
FIG. 7C is a view illustrating a portion of the section of the electronic device to which the protective cover according to the embodiment of the present disclosure is applied.

FIG. 7A is a schematic view illustrating the appearance of an electronic device to which a protective cover according to an embodiment of the present disclosure is applied, FIG. 7B is a view illustrating a cut section of the electronic device to which the protective cover according to the embodiment of the present disclosure is applied, and FIG. 7C is a view illustrating a portion of the section of the electronic device to which the protective cover according to the embodiment of the present disclosure is applied.

Referring to FIGS. 7A to 7C, a protective cover 700 disposed on the display module 11 of the electronic device 10 according to an embodiment of the present disclosure may have a shape in which the release paper is removed from the protective cover package mentioned above with reference to FIGS. 5 and 6.

The protective cover 700 may include, for example, a flat region 710 and a curved region 720. As described above with reference to FIG. 2, the curved region 720 may include, for example, a first curved portion 731 formed in a predetermined region on the upper left side, a second curved portion 732 formed in a predetermined region on the upper right side, a third curved portion 733 formed in a predetermined region on the lower right side, a fourth curved portion 734 formed in a predetermined region on the lower left side, a left-side curved portion 741 disposed at the left-side edge of the flat region 710, and a right-side curved portion 742 disposed at the right-side edge of the flat region 710. Furthermore, the curved region 720 may include an upper recess 711, a lower recess 712, and a camera hole 719.

The electronic device 10 may include the display module 11 to which the protective cover 700 is attached, a housing 18 surrounding the display module 11, a receiver 13, a camera 19, a home button 12, touch keys 12a and 12b, a connector 17, a sensor 14, and the like. Additionally, the electronic device 10 may further include a back cover 21. The display module 11 of the electronic device 10 with the above-described structure may include a flat display area and a curved display area. The flat region of the protective cover 700 may be disposed on the flat display area, and the curved region of the protective cover 700 may be disposed on the curved display area.

According to the various embodiments, a protective cover of an electronic device according to an embodiment may include a first protective layer including a flat region and a curved region and having a specified transparency, the curved region being disposed at at least part of an edge of the flat region and having a specified curvature, a second protective layer disposed below the first protective layer, the second protective layer being thicker than the first protective layer by a specified thickness or more, a bonding layer for bonding the first protective layer and the second protective layer, and an adhesive layer disposed below the second protective layer. The second protective layer may be thicker than the first protective layer.

According to various embodiments, a structure including the first protective layer and the second protective layer may have a specified tensile modulus in a range of 300 MPA to 1500 MPA.

According to various embodiments, the first protective layer may include a high-hardness support layer having a specified hardness, a hard coating layer disposed above or below the high-hardness support layer, and an anti-fingerprint (AF) layer disposed above or below the hard coating layer.

According to various embodiments, the first protective layer may include a high-hardness support layer having a specified hardness and a hard coating layer disposed above or below the high-hardness support layer and containing fluorine.

According to various embodiments, the first protective layer may have a specified thickness in a range of 25 μm to 75 μm.

According to various embodiments, the first protective layer may be formed of PET.

According to various embodiments, the second protective layer may have a specified thickness in a range of 25 μm to 125 μm and may be formed to be thicker than the first protective layer.

According to various embodiments, the second protective layer may be formed of at least one of cast or non-oriented PET, PO, and CPP.

According to various embodiments, the second protective layer may be formed of a material having an elongation of 210% or more.

According to various embodiments, the bonding layer may have a specified thickness in a range of 5 μm to 30 μm.

According to various embodiments, the adhesive layer may have a specified thickness in a range of 25 μm to 50 μm.

According to various embodiments, the adhesive layer may have an adhesive force of 100 gf/in to 500 gf/in (or 400 gf/in).

According to various embodiments, the protective cover may further include at least one cut-away portion disposed in a curved corner region of the protective cover.

According to the various embodiments, a protective cover package of an electronic device according to an embodiment may include: a protective cover of the electronic device that includes a first protective layer including a flat region and a curved region and having a specified transparency, the curved region being disposed at at least part of an edge of the flat region and having a specified curvature, a second protective layer disposed below the first protective layer, the second protective layer being thicker than the first protective layer by a specified thickness or more, a bonding layer for bonding the first protective layer and the second protective layer, and an adhesive layer disposed below the second protective layer, wherein a structure including the first protective layer and the second protective layer has a tensile modulus in a range of 300 MPA to 1500 MPA; first release paper disposed above the first protective layer; and second release paper disposed below the adhesive layer, wherein the first release paper is formed to be thicker than the first protective layer.

According to various embodiments, the first release paper may be formed to be thicker than the second release paper.

According to various embodiments, the protective cover package may further include a slip layer between the adhesive layer and the second release paper.

According to various embodiments, the first release paper may have a specified thickness in a range of 60 μm to 100 μm.

According to various embodiments, the second release paper may have a specified thickness in a range of 25 μm to 50 μm.

According to the various embodiments, an electronic device according to an embodiment may include a protective cover and a display module to which the protective cover adheres, wherein at least part of the display module includes a curved display area. The protective cover may include a first protective layer including a flat region and a curved region and having a specified transparency, the curved region being disposed at at least part of an edge of the flat region and having a specified curvature, a second protective layer disposed below the first protective layer, the second protective layer being thicker than the first protective layer by a specified thickness or more, a bonding layer for bonding the first protective layer and the second protective layer, and an adhesive layer disposed below the second protective layer. A structure including the first protective layer and the second protective layer may have a tensile modulus of 300 MPA to 1500 MPA.

According to various embodiments, the first protective layer may have a specified thickness in a range of 25 μm to 75 μm, and the second protective layer may have a specified thickness in a range of 25 μm to 125 μm and is formed to be thicker than the first protective layer.

While the present disclosure has been shown and described with reference to various embodiments thereof, it will be understood by those skilled in the art that various changes in form and details may be made therein without departing from the spirit and scope of the present disclosure as defined by the appended claims and their equivalents.

The invention claimed is:

1. A protective cover for an electronic device, attachable to a display of the electronic device, the protective cover comprising:
    a first protective layer including a flat region and a curved region and having a specified transparency, the curved region being disposed at at—least part of an edge of the flat region and having a specified curvature, the first protective layer including at least a high-hardness support layer having a slip property of a specified magnitude;
    a second protective layer disposed below the first protective layer;
    a bonding layer configured to bond the first protective layer and the second protective layer;
    an adhesive layer disposed below the second protective layer, wherein the second protective layer formed of a different material than the first protective layer, such that a sum of tensile modulus of the first and second protective layer is less than an adhesive force of the adhesive layer;
    a first release paper disposed upper the protective cover;
    a second release paper disposed below the adhesive layer, wherein the first release paper is formed to be thicker than the second release paper; and
    a slip layer disposed between the second release paper and the adhesive layer, providing slippage between the protective cover and the display in the curved regions of the protective cover when the protective cover is adhered to the display,
    wherein the slippage between the second release paper and the adhesive layer generated via the slip layer reduces lateral friction of the adhesive layer to the display in the curved regions, increasing adhesion of the protective cover to the display by preventing removal of the protective cover from the display in the curved region by curling, when thermal expansion or contraction causes the protective cover to move relative to the display, and
    wherein the second protective layer is configured to adhere to a front surface of a cover window included in the display of the electronic device by the adhesive layer, the first and second protective layer are separate from the display, and the second protective layer is thicker than the first protective layer by a specified difference in thickness.

2. The protective cover of claim 1, wherein a structure including the first protective layer and the second protective layer has a specified tensile modulus in a range of 300 MPA to 1500 MPA.

3. The protective cover of claim 1, wherein the first protective layer includes:
    the high-hardness support layer having a specified hardness;
    a hard coating layer disposed above or below the high-hardness support layer; and
    an anti-fingerprint (AF) layer disposed above or below the hard coating layer.

4. The protective cover of claim 1, wherein the first protective layer includes:
    the high-hardness support layer having a specified hardness; and
    a hard coating layer disposed above or below the high-hardness support layer and containing fluorine.

5. The protective cover of claim 1, wherein the first protective layer includes a thickness in a range of 25 μm to 75 μm.

6. The protective cover of claim 5, wherein the first protective layer is formed of PET.

7. The protective cover of claim 1, wherein the second protective layer includes a thickness in a range of 25 μm to 125 μm and is formed to be thicker than the first protective layer.

8. The protective cover of claim 7, wherein the second protective layer is formed of at least one of cast or non-oriented PET, PO, and CPP.

9. The protective cover of claim 1, wherein the second protective layer is formed of a material having an elongation of at least 210%.

10. The protective cover of claim 1, wherein the bonding layer includes a thickness in a range of 5 μm to 30 μm.

11. The protective cover of claim 1, wherein the adhesive layer includes a thickness in a range of 25 μm to 50 μm.

12. The protective cover of claim 11, wherein the adhesive layer has an adhesive force of 100 gf/in to 500 gf/in.

13. The protective cover of claim 1, further comprising:
    at least one cut-away portion disposed in a curved corner region of the protective cover.

* * * * *